United States Patent [19]

Gareis

[11] 4,450,427

[45] May 22, 1984

[54] CONTACTOR WITH FLUX SENSOR

[75] Inventor: Ronald E. Gareis, Charlottesville, Va.

[73] Assignee: General Electric Company, Charlottesville, Va.

[21] Appl. No.: 332,732

[22] Filed: Dec. 21, 1981

[51] Int. Cl.³ .......... H01L 43/04

[52] U.S. Cl. .......... 338/32 H; 324/251

[58] Field of Search .......... 338/32 H, 32 R; 335/1, 335/131, 2; 324/251, 252, 207, 208, 235, 117 H, 145; 361/152, 203

[56] References Cited

U.S. PATENT DOCUMENTS

| | | | |
|---|---|---|---|
| 1,691,920 | 11/1928 | Chapman | 335/131 |
| 2,725,488 | 11/1955 | Hueffed et al. | 335/131 X |
| 2,906,945 | 9/1959 | Weiss | 323/368 X |
| 2,913,557 | 11/1959 | Immel et al. | 200/147 A |
| 3,060,370 | 10/1962 | Varterasian | 323/94 |
| 3,172,020 | 3/1965 | Spinelli et al. | 361/159 X |
| 3,482,163 | 12/1969 | Peek et al. | 361/149 X |
| 3,671,814 | 6/1972 | Dick | 361/154 |

FOREIGN PATENT DOCUMENTS

| | | |
|---|---|---|
| 831484 | 3/1960 | United Kingdom . |
| 1234420 | 6/1971 | United Kingdom . |
| 1324445 | 7/1973 | United Kingdom . |
| 1415422 | 11/1975 | United Kingdom . |
| 2013000 | 8/1979 | United Kingdom . |
| 1594578 | 7/1981 | United Kingdom . |

*Primary Examiner*—C. L. Albritton
*Attorney, Agent, or Firm*—Ormand R. Austin

[57] ABSTRACT

An electromagnetic contactor is provided with a flux sensing device, preferably a Hall effect sensor, mounted in its magnetic circuit. The magnetic circuit includes an air gap within which the flux sensing device is mounted. The air gap can be adjusted to control the percent of magnetic flux impinging on the flux sensing device whereby a signal can be taken from the device indicative of the magnitude of flux in the magnetic circuit. The signal can be used to control electrical excitation of the contactor at a predetermined flux level.

6 Claims, 6 Drawing Figures

CONTACTOR WITH FLUX SENSOR

Cross reference is made to application Ser. No. 332,731 entitled "Controlled Flux Contactor" assigned to General Electric Company and filed concurrently herewith.

BACKGROUND

An electromagnetic relay or contactor in its simplest form consists of a magnetic circuit comprising a fixed core, a moveable armature and one or more air gaps; an electrically energizable actuating coil; one or more sets of contacts; and springs for returning the armature to its unenergized position. When a voltage source of sufficient potential is connected to the actuating coil, current through the coil creates flux in the magnetic circuit. When the flux reaches a value such that the magnetic force on the armature exceeds the spring force and friction forces, the armature will accelerate toward the fixed core. As the air gap between the fixed core and moveable armature decreases, the magnetic circuit reluctance decreases thereby increasing the flux and magnetic force on the armature. Although the spring force opposing armature movement also increases, its increase is substantially linear over the range of motion whereas the flux increase is inversely proportional to the square of the distance. Accordingly, a very strong magnetic force is exerted on the armature at its minimum distance (air gap) from the fixed core.

Although the force on the armature is not itself deterimental, and in some instances may be beneficial in assuring that closed contacts are immune to external vibration, the energy dissipated in the coil is at best inefficient and at worst may overheat the coil and damage it. Recognition of this problem has led to several solutions. Since the actuating current is of necessity initially high in order to generate sufficient flux to move the armature from its rest position, reduction of actuating current is impractical. An alternate solution is to sense armature position using a secondary set of contacts and to reduce coil excitation to a holding current level. Another alternative is to provide a separate holding coil which becomes energized upon contact closure. Both of these alternatives are in current use and both have limitations. For example, care must be taken to assure that the magnetic force is maintained sufficiently strong to avoid vibration induced dropouts which can result in oscillation of the contactor. The holding coil approach also may require additional space if a separate coil is formed on the contactor.

It is an object of the present invention to provide an improved electromagnetic contactor.

It is a further object of the present invention to provide an electromagnetic contactor incorporating a magnetic flux sensing device.

In accordance with the present invention, an electromagnetic contactor is provided with a fixed air gap in its magnetic circuit and a magnetic flux sensor is placed in the air gap preferably, the flux sensor comprises a Hall effect device. The air gap is adjusted to provide a substantially constant percent of magnetic flux passing through the area of the sensor. Since movement of the contactor armature varies the magnetic circuit reluctance and total magnetic flux the sensor provides an indication of the total flux in the magnetic circuit. In a preferred embodiment, the sensor is positioned in an air gap formed in an outer magnetic structure surrounding the contactor energizing coil.

DESCRIPTION OF THE DRAWING

The novel features which are believed to be characteristic of the invention are set forth in the appended claims. The invention itself, however, both as to its advantages and objects thereof may best be understood by reference to the following description taken in conjunction which the accompanying drawing in which:

DETAILED DESCRIPTION

Figure 1:
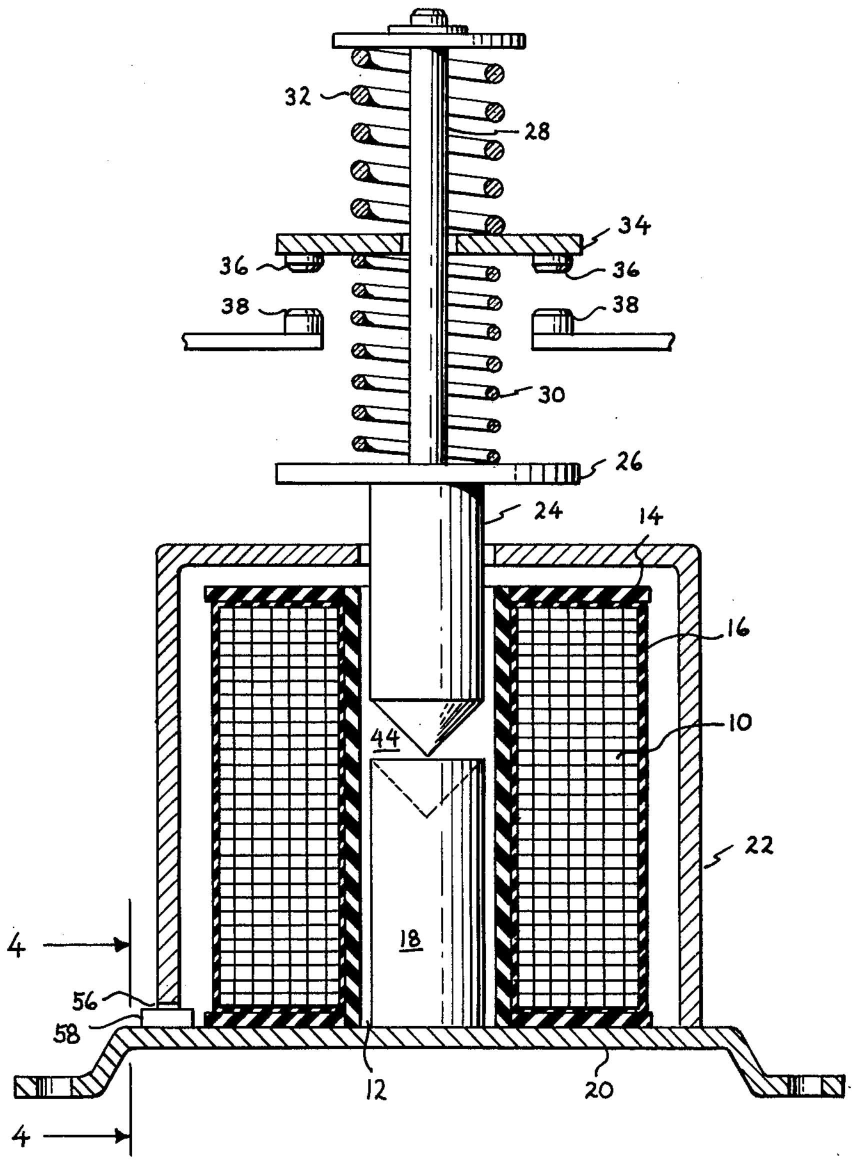
FIG. 1 is a simplified, partial cross-sectional view of a contactor incorporating a flux sensing device in accordance with the present invention.

Referring now to FIG. 1 there is illustrated a simplified cross-sectional view of an electromagnetic contactor incorporating the present invention. The contactor includes an electrically energizable actuating coil 10 which may be formed in a substantially circular arrangement about a central opening 12. The coil 10 may be encapsulated by or formed on an insulative member 14. Additional taped insulation 16 is also occasionally used to wrap the coil 10 prior to assembly in the formed insulation 14. The coil 10 is mounted on a magnetic core member including an inner section 18 extending into the central opening 12 and an outer section comprising a base member 20 and an upper "U" shaped member 22. The outer "U" shaped member 22 may be held in place against the base member 20 by an external insulative housing (not shown) generally attached to the base member 20 by screws and pressing down upon the "U" shaped upper member 22. The inner section 18 of the fixed core member is typically attached to the base member 20 by means of screws (not shown) or spot welding or other means well known in the art.

A movable armature 24 extends into the central opening 12 of coil 10 coaxially with the inner section 18. The lower end of the armature 24 is adapted to mate the upper end of the inner section 18. Preferably the mating surface of the armature 24 and inner section 18 are of a conical shape whereby the permanence of the working gap 44 between the two surfaces increases less rapidly with motion. The upper end of the armature 24 has attached thereto a circular plate or washer 26. A shaft 28 extends upward from the washer 26 and has mounted thereon a return spring 30 and a contact spring 32. A movable contact tip carrier 34 is mounted on the shaft 28 intermediate the springs 30 and 32. The contact tip carrier 34 has contact tips 36 mounted on each end thereof formating with fixed contact tips 38. The fixed contact tips 38 connect to external circuits and are mounted on the insulative housing (not shown) which holds all the above described components of the contactor in position. A more detailed description of a contactor constructed substantially in accordance with the arrangement shown in FIG. 1 may be had by reference to U.S. Pat. No. 2,913,557. The contactor thus far described is generally considered to be within the prior art.

Figure 2:
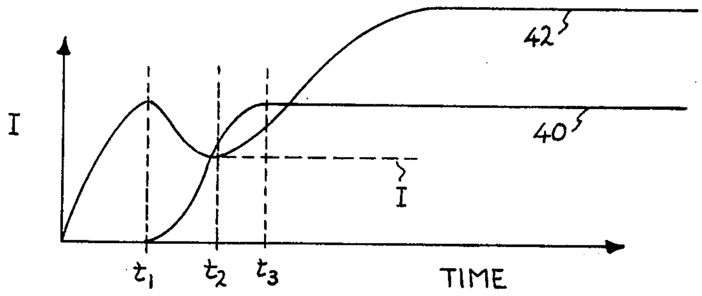
FIG. 2 is a graphical representation of contactor actuating coil current as a function of contact displacement and time.

Reference is now made to FIG. 2 in which there is illustrated a graphical representation of current in the actuating coil 10 as a function of time and position of the movable armature 24. Contact position or armature position is represented by the line 40 and energizing coil current is represented by the line 42. When a voltage potential is applied to the coil 24, current begins to rapidly increase in the coil rising to a first peak position at time t1 at which point the armature 24 begins to accelerate toward the inner section 18 of the fixed core member. As the armature moves, the variable air gap 44 begins decreasing changing the reluctance in the magnetic circuit comprising the core member and the armature 24 such that the coil current actually begins to decrease in value. At approximately time t2 the contacts 36 and 38 meet and the armature now must pull down against both the return spring 30 and the contact spring 32. This increased resistance causes armature motion to slow and the current in the coil to begin to increase as the armature comes to rest. At time t3 the armature has reached its final position and is held in place by the magnetic field generated by the coil 10. However, the coil current continues to increase until a maximum current value is reached determined by the magnitude of potential applied to the coil and the impedance of the circuit. It will be appreciated from the graph in FIG. 2 that for constant applied voltage the energy applied to the coil can be considerably more than is required to hold the contacts in their closed position. Thus, in the prior art it has been common practice to utilize a second set of contacts which insert resistance in the coil circuit in order to reduce the energizing current applied to the coil. Alternately, some systems have incorporated a second holding coil which is operated at a lower potential than the actuating coil.

Figure 3:
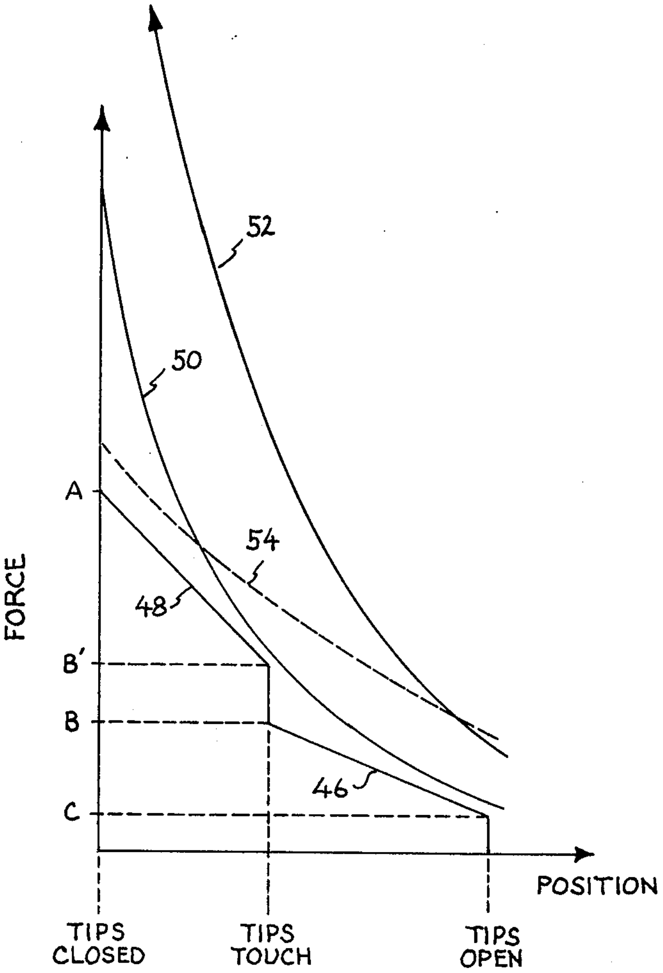
FIG. 3 is a graphical representation of force on a contactor armature at selected excitation levels as a function of contact position.

FIG. 3 is a graph of force required to move the armature 24 as a function of its position. The line 46 represents the linear increase in force to move the armature generated by the return spring 30. Between positions C and B, the force increases at a gradual rate with a slope depending upon the spring constant. At point B when the tips touch, the contact spring suddenly exerts force on the tips causing the force to jump from B to B'. The force then linearly increases from point B' to point A where the armature is pulled to its final position. The curve 50 represents a graph of force versus position generated by the actuating coil 10 when excited with a constant minimum potential necessary to cause the armature to accelerate toward its final position. The minimum voltage line 50 illustrates that the generated force follows the required pickup force fairly constantly until the contact tips actually touch and the contact spring begins to exert force on the armature. At this point the force generated by the coil increases at a much higher rate to a value that is actually greater than required to maintain the contacts in the closed position. The line 52 represents the force versus poistion generated by the contactor coil 10 when excited at its rated voltage. The line 52 illustrates that the coil is actually capable of generating considerably more closing force than is required to operate the contactor. The dotted line 54 represents force as a function of position if the contactor coil 10 is excited such that a constant level of magnetic flux is maintained through the armature and core member. Accordingly, it is an object of this invention to provide a means of providing a measurement of armature flux whereby flux can be maintained at a constant level to thereby minimize energy dissipation in the contactor coil 10.

Referring again to FIG. 1, it will be seen that one leg of the "U" shaped upper member 22 is provided with an air gap between it and the base member 20. Although other locations could be chosen for placing this fixed air gap, this particular location is convenient because of the construction of a typical contactor. Within this air gap 56 is placed a magnetic flux sensor, such as a Hall effect sensor device 58. As is well known, a Hall effect device is a semiconductor crystal which generates a voltage across opposite terminals thereof that is a product of current flowing between the remaining terminals and the magnetic field in a direction perpendicular to the current. A device suitable for such application is available from Sprague Electric Company under their designation type UGN-3501M as a linear output Hall effect sensor. In the contactor arrangement, the magnetic flux generated by the coil 10 flows through the path formed by the inner section 18, armature 24 and the two legs of the "U" shaped upper core member 22 into the base and then back to the inner core member section 18. In traversing this loop magnetic flux generated by the coil 10 passes through both the variable air gap between the armature 24 and inner core member section 18 and also through the fixed air gap within which the Hall effect sensor device 58 is located.

Figure 4:
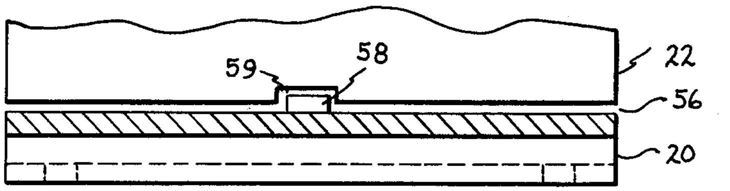
FIG. 4 is a partial cross section illustrating flux sensor placement and air gap in the contactor of FIG. 1.

Referring to FIG. 4, there is shown a side view of that section of the contactor of FIG. 1 in which the Hall device 58 is located. It can be seen that the air gap 56 extends across the width of the base member 20. A slightly enlarged air gap section 59 is centrally located in the depending leg member of the upper "U" shaped section 22. The Hall device 58 is placed within the slightly enlarged air gap 59. The flux through the device 58 can be adjusted by varying the air gap 56.

Use of the contactor construction illustrated in FIG. 1 in combination with the Hall device 58 placed in a path to monitor the magnitude of flux generated by the coil 10 enables the electrical energy supply to the coil 10 to be regulated in such a manner as to maintain a constant armature flux. In actual practices, it has been found that the magnitude of flux can be brought to a level just slightly above the magnitude of flux necessary to generate a holding force to maintain the contactor in a closed position. Vibrations which tend to cause the contact tips to attempt to separate also change the variable air gap 44 which in turn effects the amount of flux in the magnetic circuit. Any slight decrease in flux is sensed by the Hall device 58 and results in a variation in the voltage generated by the device 58. This Hall voltage can be used to stabilize the magnetic field flux to maintain a constant force on the armature 24. Accordingly, the Hall device 58 can be used to create a closed loop system which maintains the magnetic flux at a level sufficient to overcome any forces which attempt to force the contact tips apart. In other words, the closed loop system automatically compensates for any additional forces which try to pull the contact tips open.

Figure 5:
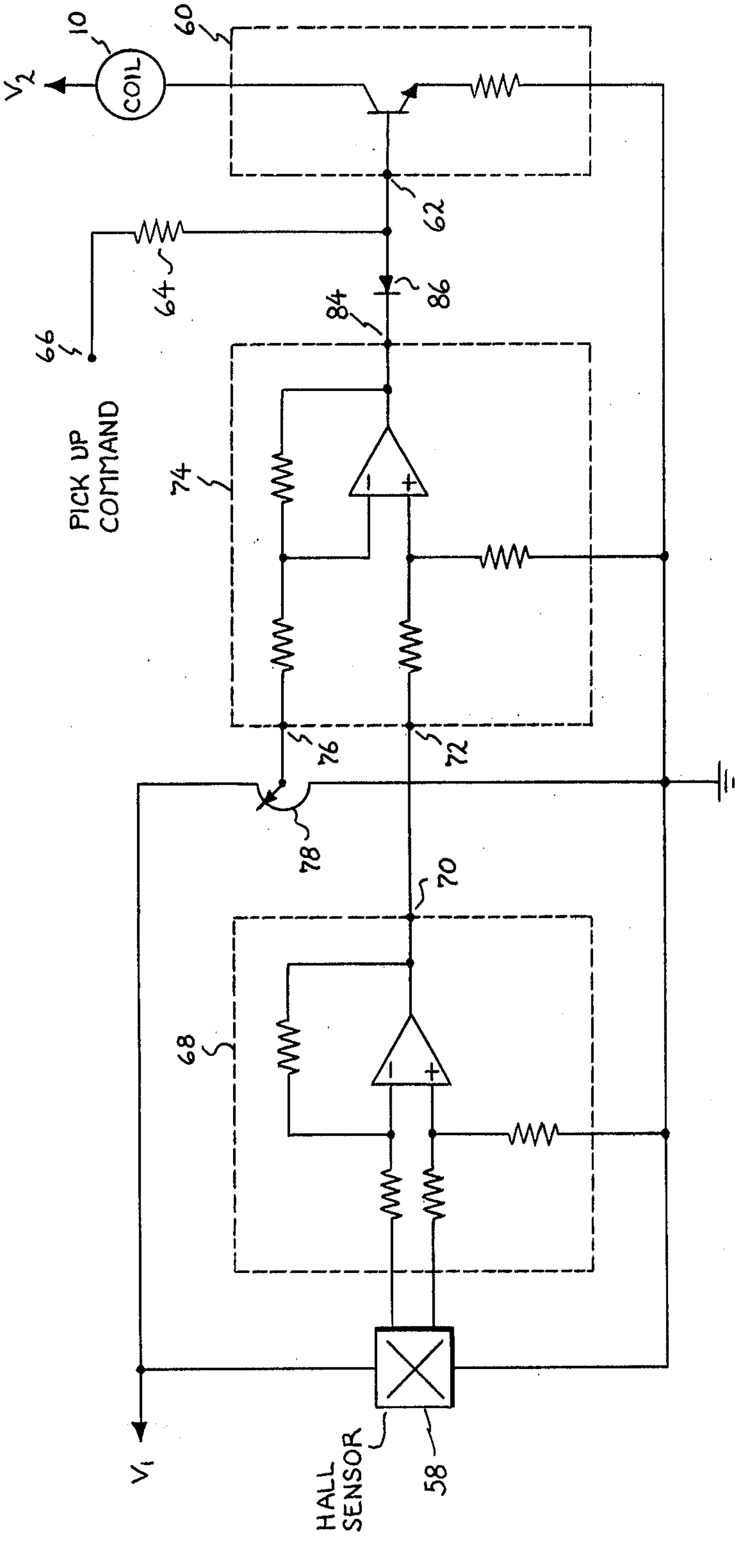
FIG. 5 is a simplified schematic diagram of a linear amplifier circuit responsive to a flux sensor for controlling contactor coil excitation; and, FIG. 6 is a simplified switching amplifier circuit responsive to a flux sensor for controlling contactor coil excitation.

Referring now to FIG. 5 there is illustrated one exemplary circuit for using the Hall device 58 to control the excitation to the coil 10. The circuit of FIG. 5 will be referred to as a linear mode flux regulator since it responds linearly to the voltage developed across the Hall device 58 as a function of the flux sensed by the device. The coil 10 has one terminal connected to an unregulated voltage supply source V2 and a second terminal connected through a controllable current source 60 to a negative voltage return. The controllable current source 60 may be transistorized current source or any other type of linearly controllable source. A control terminal 62 of the current source 60 is connected through a resistor 64 to an input terminal 66 adapted for receiving a coil pickup command. When the voltage at terminal 66 goes to a positive value, current through the resistor 64 is coupled into the control terminal 62 energizing the current source 60 thereby allowing current to pass through the coil 10.

The Hall device 58 is connected to a regulated power source V1 and a differential amplifier 68 is connected to the Hall device output terminals for detecting the variation in voltage across the device 58 as a function of the flux passing through device 58. The differential amplifier 68 may be any of the well known types such as the illustrated operational amplifier with resistive feedback. The differential amplifier 68 merely converts the double ended signal from Hall device 58 to a single ended signal. An output terminal 70 of the differential amplifier 68 is coupled to an imput terminal 72 of error amplifier 74. As will be apparent, the error amplifier 74 and differential amplifier 68 are substantially identical, the only difference being in the values of the resistors used in biasing the two circuits in order to accomodate the different levels of signals which are being amplified. A second input terminal 76 of error amplifier 74 is connected to receive an adjustable flux reference signal from a movable arm of a potentiometer 78. The potentiometer 78 allows the level of flux to be established in coil 10 to be set at any desired value, the desired value for any particular contactor being determined by imperical measurement or by calculation using methods well known in the art. An output terminal 80 of error amplifier 74 is connected through a diode 86 to the input terminal 62 of the current source 60.

In operation, when a pickup command is applied to terminal 66, the current source 60 is gated into conduction allowing current to flow through the coil 10. The flux sensor or Hall effect device 58 provides a differential output signal proportional to the level of flux generated by the coil 10. This differential signal is amplified by amplifier 68 and converted to a single ended signal which is coupled to the input terminal 72 of error amplifier 74. The error amplifier 74 compares the relative amplitude of the reference signal from potentiometer 78 and the output signal from amplifier 68. The components of the error amplifier 74 are chosen such that as the measured flux increases above the level established by the potentiometer 78, the voltage developed at the output terminal 84 becomes negative with respect to the pickup command voltage. The polarity of the diode 86 is such as to cause the voltage at terminal 62 to follow the smaller of either the voltage at the terminal 66 or the voltage at terminal 84. Accordingly, as the voltage at terminal 84 begins to drop, the drive to the current source 60 is reduced. Thus, the magnitude of flux in the coil 10 is regulated to the predetermined value established by the potentiometer 78.

Figure 6:
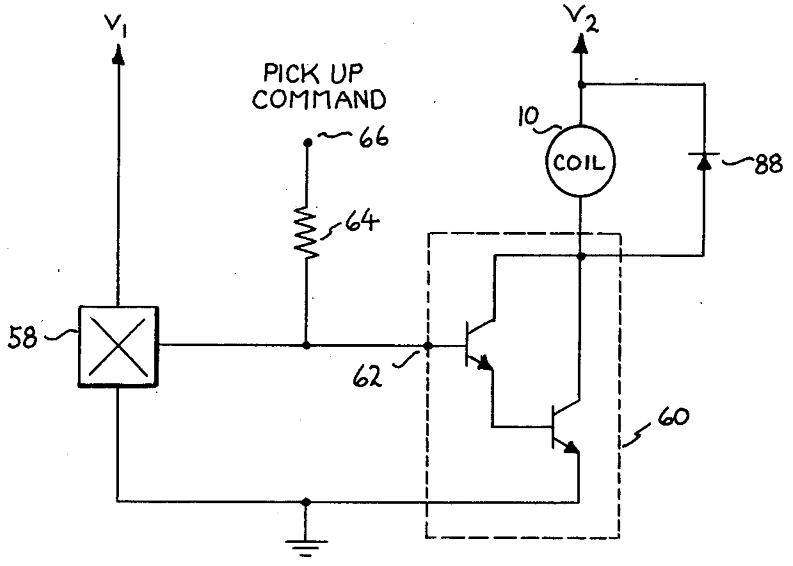

Referring now to FIG. 6 there is illustrated a switching regulator for controlling the coil 10 which is more simple and efficient in operation than the linear regulator of FIG. 5. In the switching regulator, the Hall device 58 is a commonly available type used presently in magnetically triggered keyboard switches. It has the characteristics that for flux exceeding a predetermined maximum value, its output is grounded. For flux less than a predetermined minimum value, its output is open. There is also a dead band between the maximum and minimum switching states and the dead band width is normally about thirty percent of the maximum flux at which the output switches to the grounded condition. Such a device is available from Sprague Electric Company under their designation type UGN-3020T Hall effect digital switch.

The Hall device 58 is again connected between a regulated voltage source V1 and ground. The coil 10 is connected between the unregulated voltage source V2 and a current source 60, illustrated as a Darlington transistor amplifier, the source 60 being connected to the negative return. Since this system is designed to operate in the switching mode, a free-wheeling diode 88 is connected in shunt around the coil 10. The coil pickup command is again connected to a terminal 66 and coupled through the resistor 64 to the input terminal 62 and the current source 60. The output terminal of the Hall device 58 is also connected to the terminal 62. As will be apparent, the pickup command applied to the terminal 66 gates the current source 60 into conduction which causes current to begin to flow through the coil 10. The current builds up flux in the coil inducing flux in the core member of the contactor which is sensed by the Hall device 58. When flux reaches the predetermined maximum value, the device 58 grounds the terminal 62 turning off the current source and removing excitation to the coil 10. Current in the coil 10 circulates through the free-wheeling diode 88 gradually decaying and allowing flux to decay. When the flux drops below the predeterined minimum value, the Hall device 58 opens circuits and allows the pickup command at terminal 66 to again energize the current source 60. This Off-On action regulates the flux in the contactor in a chopping fashion to the desired value. The system thus minimizes the energy expended in a contactor by regulating current in the actuating coil 10 to a value just sufficient to maintain a desired level of magnetic force on the armature 24. The system automatically compensates for vibration or other external forces tending to open the contacts since any such force also tends to change the air gap 44 and effect the flux level in the contactor magnetic circuit. The OFF-ON switch levels can be adjusted by varying air gap 5 to thereby change the amount of flux impinging on device 58.

Although preferred embodiments of the invention have been illustrated, other modifications, arrangements and variations will be apparent to those skilled in the art. Accordingly, it is intended that the invention not be limited to the illustrative embodiments but that the appended claims be interpreted to cover all such modifications, arrangements and variations as fall within the true spirit and scope of the invention.

What is claimed is:

1. An electromagnetic contactor assembly comprising:

a magnetic circuit including a fixed core member, a moveable armature, a variable air gap between said fixed core member and said moveable armature and a fixed air gap in said core member;

an electrically energizable actuating coil arranged for establishing an operating magnetic flux in said core member;

a spring member arranged for biasing said armature in a position wherein said variable air gap is at a maximum; and a magnetic flux sensor mounted in said fixed air gap for providing an output signal representative of the magnitude of flux in said core member.

2. The contactor assembly of claim 1 wherein said flux sensor comprises a Hall effect sensor.

3. The contactor assemply of claim 2 wherein said core member comprises an inner section extending into said coil and an outer section extending around an outer surface of said coil, said fixed air gap being located in said outer section and said armature completing said magnetic circuit between said inner and outer sections of said core member.

4. The contactor assembly of claim 3 wherein said outer section comprises a substantially flat base member and a U-shaped upper member, said inner section being centrally located on said base member in an upwardly extending position, said coil being seated on said base member and having a central opening into which said inner section extends, said U-shaped member being placed over said coil with opposing legs extending downward toward said base member, an opening being provided in said U-shaped member to provide a passageway for said armature, and said fixed air gap being formed between one leg of said U-shaped member and said base member.

5. The contactor assembly of claim 4 wherein said fixed air gap is formed by spacing said one leg of said U-shaped member a predetermined distance from said base member along their full juncture, an enlarged air gap being formed centrally of said fixed air gap and said Hall device being positioned in said enlarged air gap.

6. The contactor assembly of claim 5 wherein said armature has a conical shaped face and said inner section has a mating face at said variable air gap.

* * * * *